United States Patent [19]

Lowrance

[11] Patent Number: 5,469,035
[45] Date of Patent: Nov. 21, 1995

[54] TWO-AXIS MAGNETICALLY COUPLED ROBOT

[75] Inventor: Robert B. Lowrance, Los Gatos, Calif.

[73] Assignee: Applied Materials, Inc., Santa Clara, Calif.

[21] Appl. No.: 298,382

[22] Filed: Aug. 30, 1994

Related U.S. Application Data

[60] Continuation of Ser. No. 25,204, Mar. 2, 1993, Pat. No. 5,355,066, which is a division of Ser. No. 644,852, Jan. 22, 1991, Pat. No. 5,227,708, which is a continuation of Ser. No. 424,771, Oct. 20, 1989, abandoned.

[51] Int. Cl.⁶ ..................................... B25J 9/14
[52] U.S. Cl. .................. 318/568.1; 318/568.12; 318/568.21; 318/568.22; 901/15
[58] Field of Search .................. 318/560–646; 395/80–89; 901/3.5, 7, 9, 12, 17, 19, 23, 25, 27, 45, 47, 29, 15, 28, 30; 310/75 D, 83

[56] References Cited

U.S. PATENT DOCUMENTS

| | | | |
|---|---|---|---|
| 4,634,889 | 1/1987 | Foggia et al. | 307/104 |
| 4,651,591 | 3/1987 | Wurst | 74/675 |
| 4,900,997 | 2/1990 | Durand et al. | 318/568.21 |
| 5,180,955 | 1/1993 | Karidis et al. | 318/568.1 |
| 5,204,573 | 4/1993 | Bederson et al. | 310/198 |
| 5,270,600 | 12/1993 | Hashimoto | 310/75 D |
| 5,291,112 | 3/1994 | Kandis et al. | 318/568.1 |
| 5,293,107 | 3/1994 | Akeel | 318/568.11 |
| 5,294,209 | 3/1994 | Naka et al. | 403/24 |

FOREIGN PATENT DOCUMENTS

| | | |
|---|---|---|
| 0160305 | 5/1985 | European Pat. Off. |
| 296235 | 12/1988 | Japan . |
| 8809246 | 5/1988 | WIPO . |

*Primary Examiner*—Paul Ip
*Attorney, Agent, or Firm*—Blakely, Sokoloff, Taylor & Zafman

[57] ABSTRACT

A robot having a pair of magnetic couplings that each couple a motor in a cylindrical first chamber to an associated cylindrical ring closely spaced from the cylindrical wall of said first chamber. The robot includes a mechanism to convert rotation of each of these rings into separate motions of the robot. In the preferred embodiment, these separate motions are radial and rotational.

42 Claims, 8 Drawing Sheets

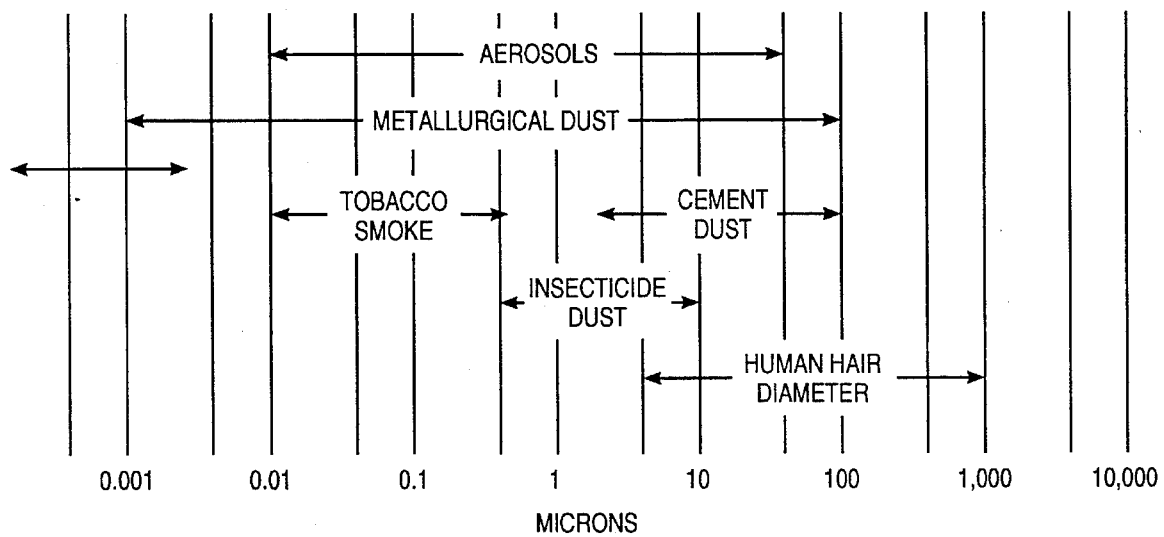
FIG_1 (PRIOR ART)
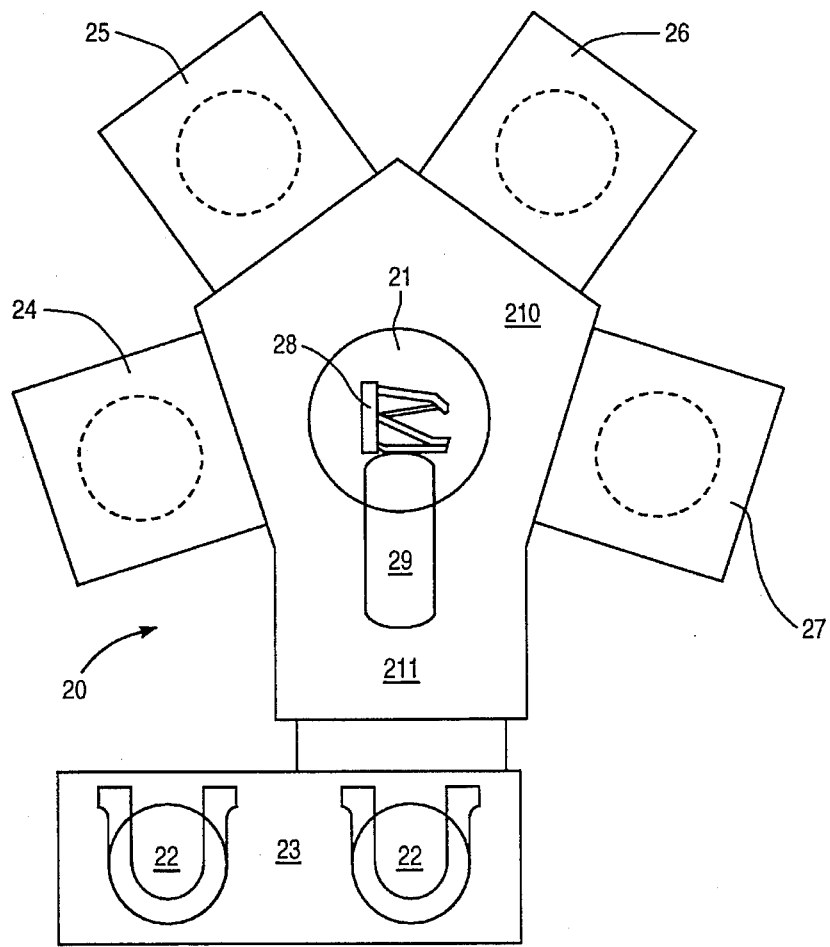
FIG_2 (PRIOR ART)

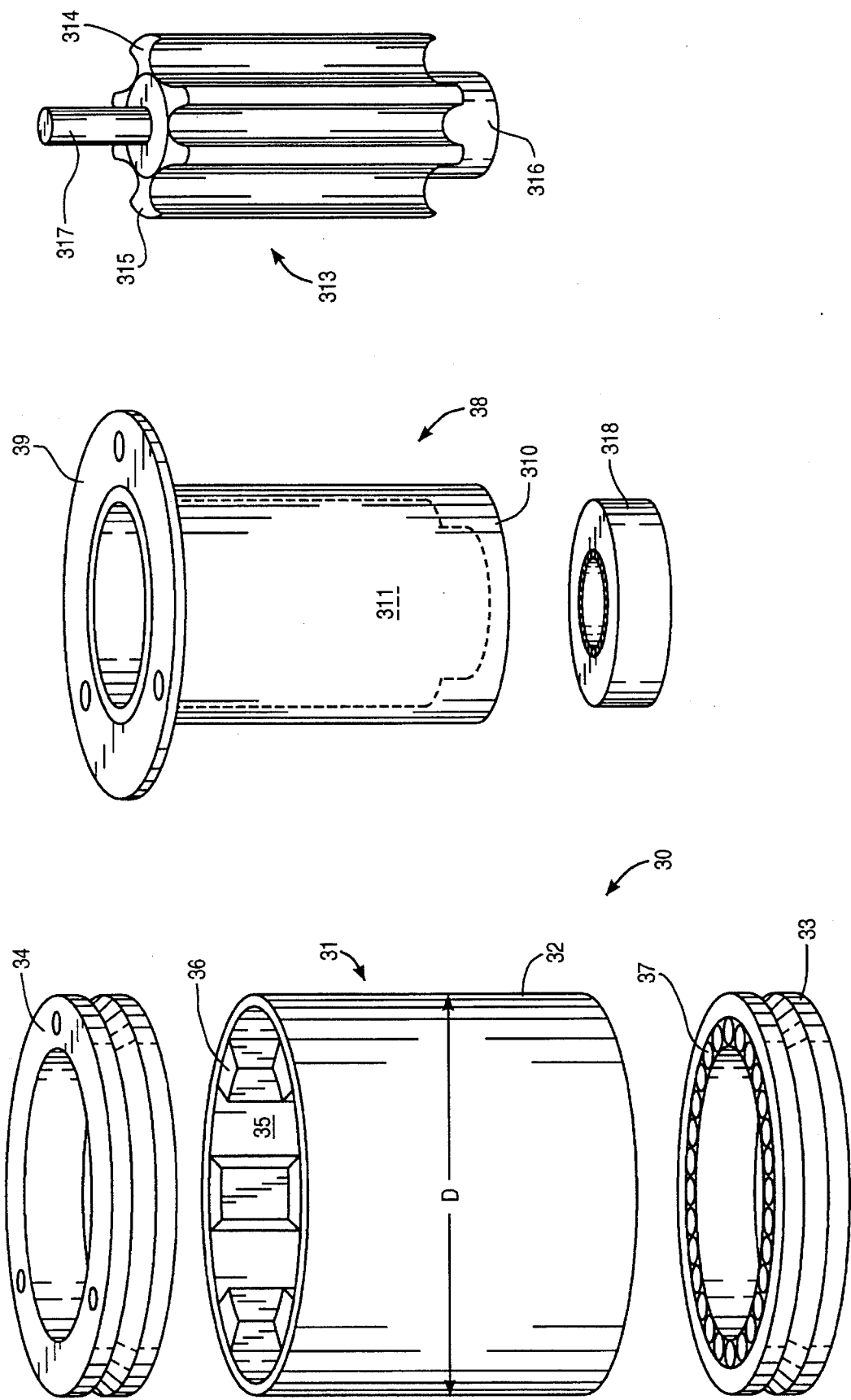
FIG_3 (PRIOR ART)

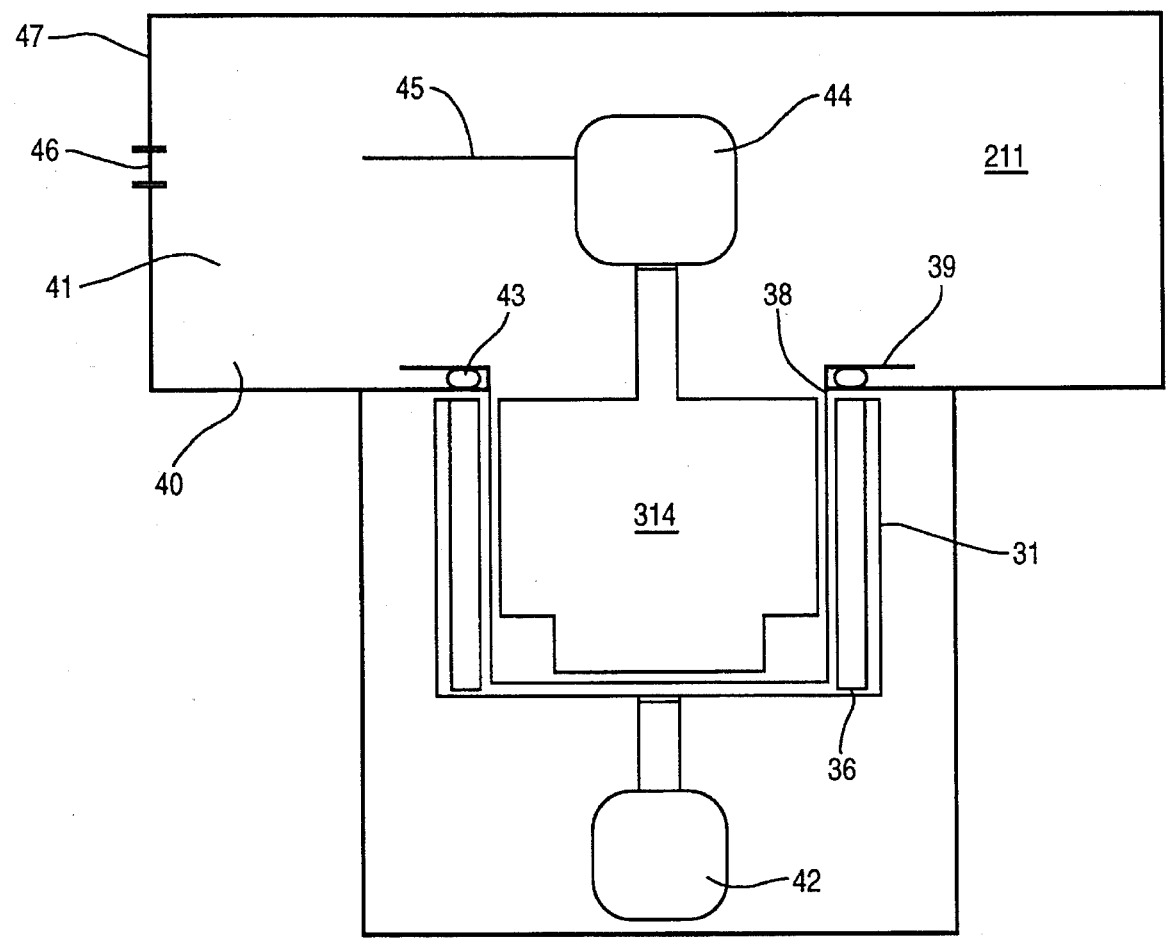
FIG_4 (PRIOR ART)

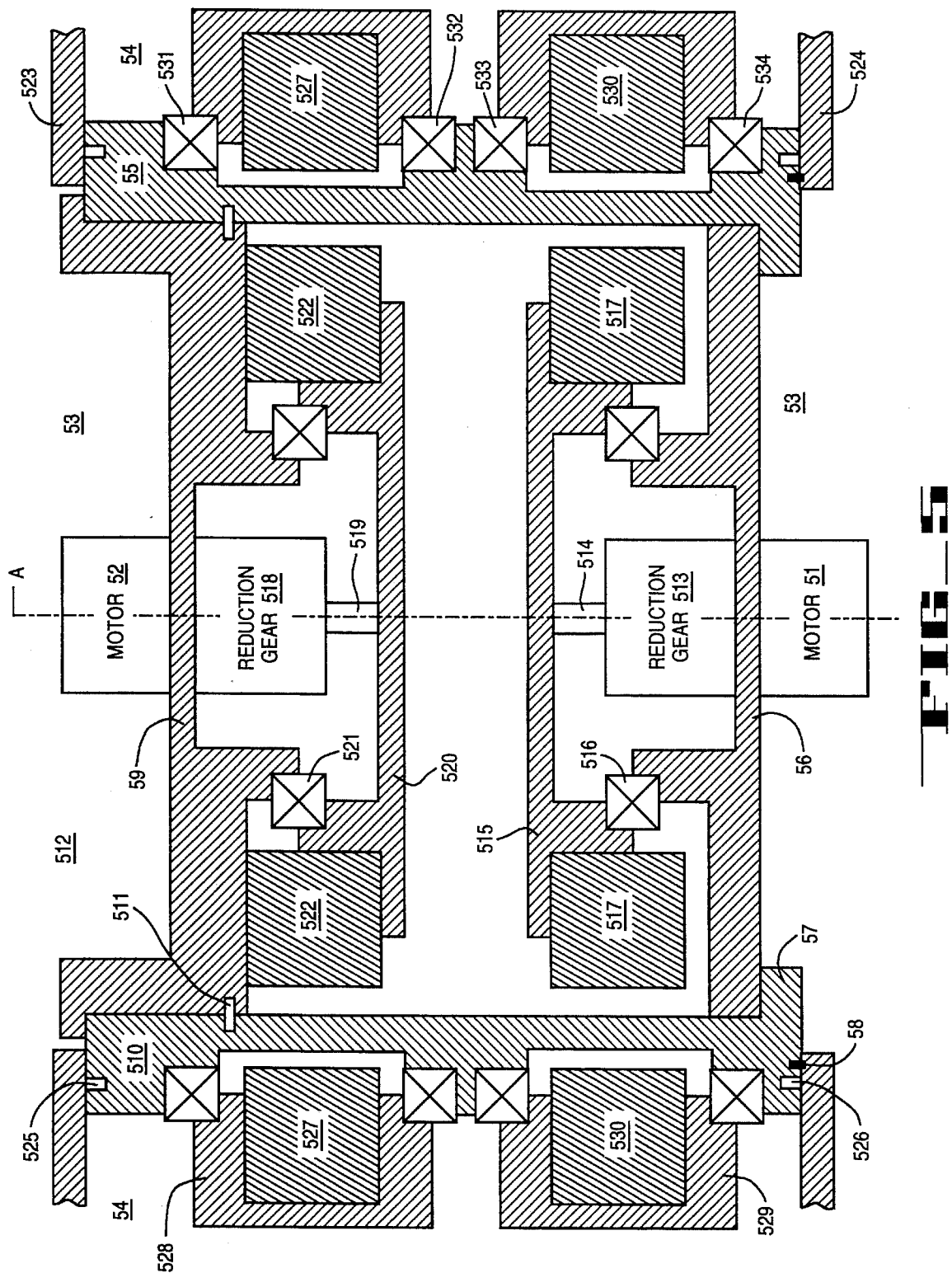
FIG_5

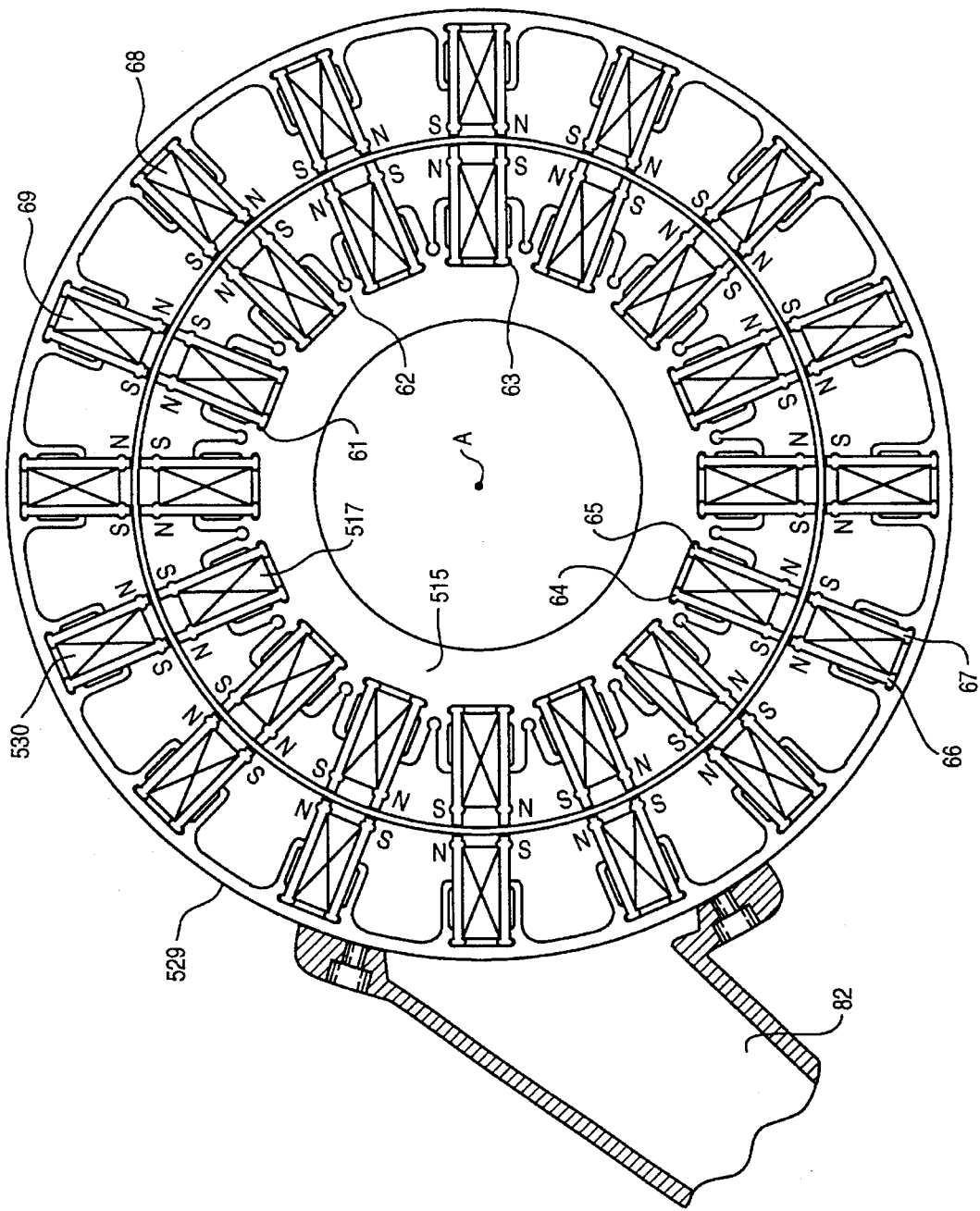

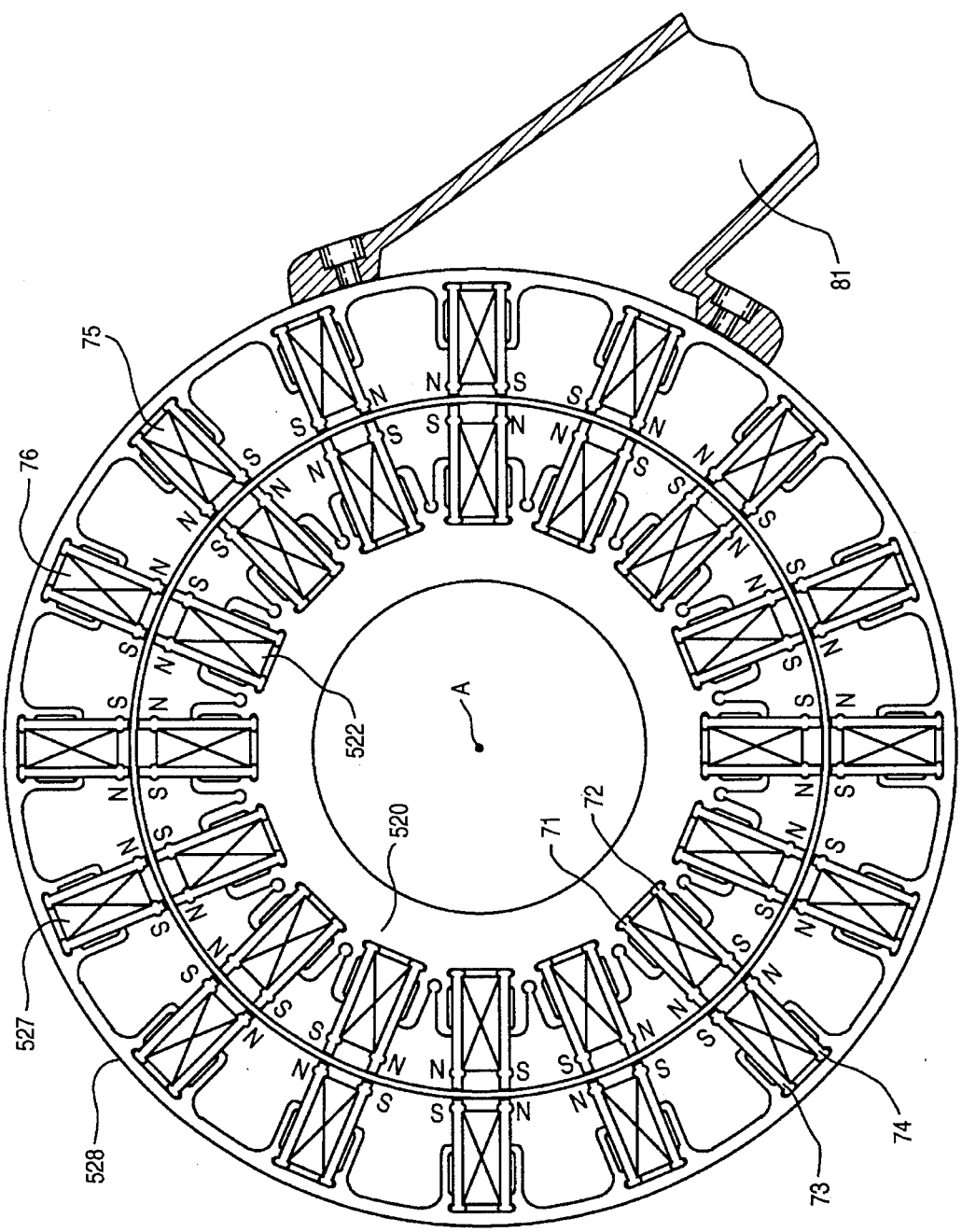
FIG_7

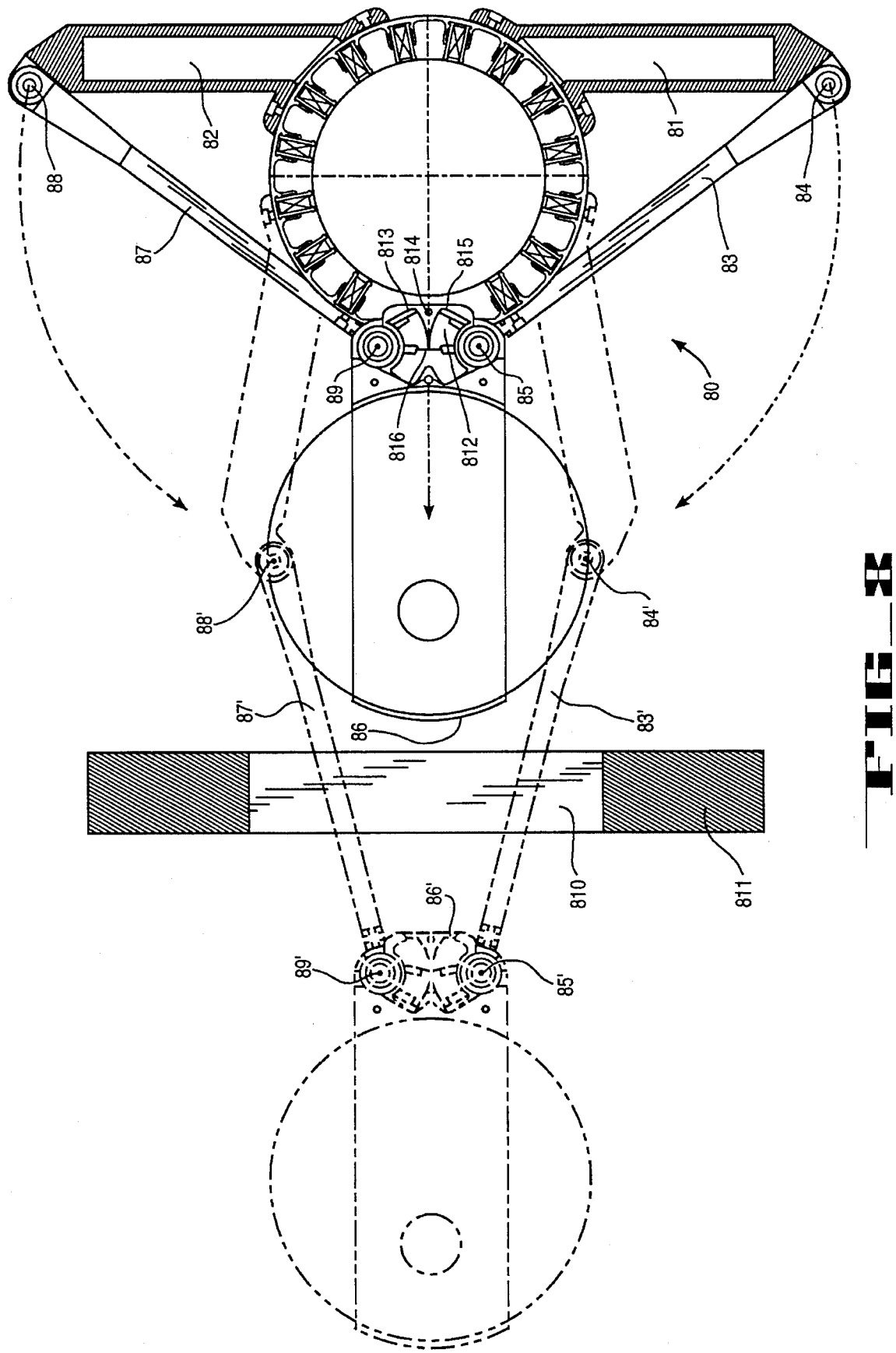

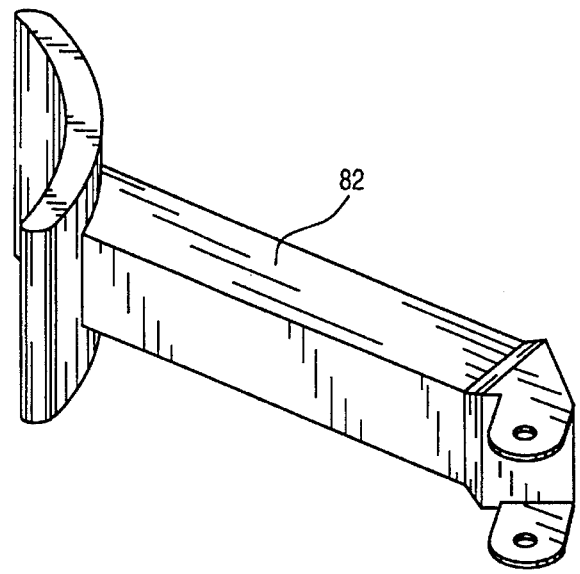
FIG_9
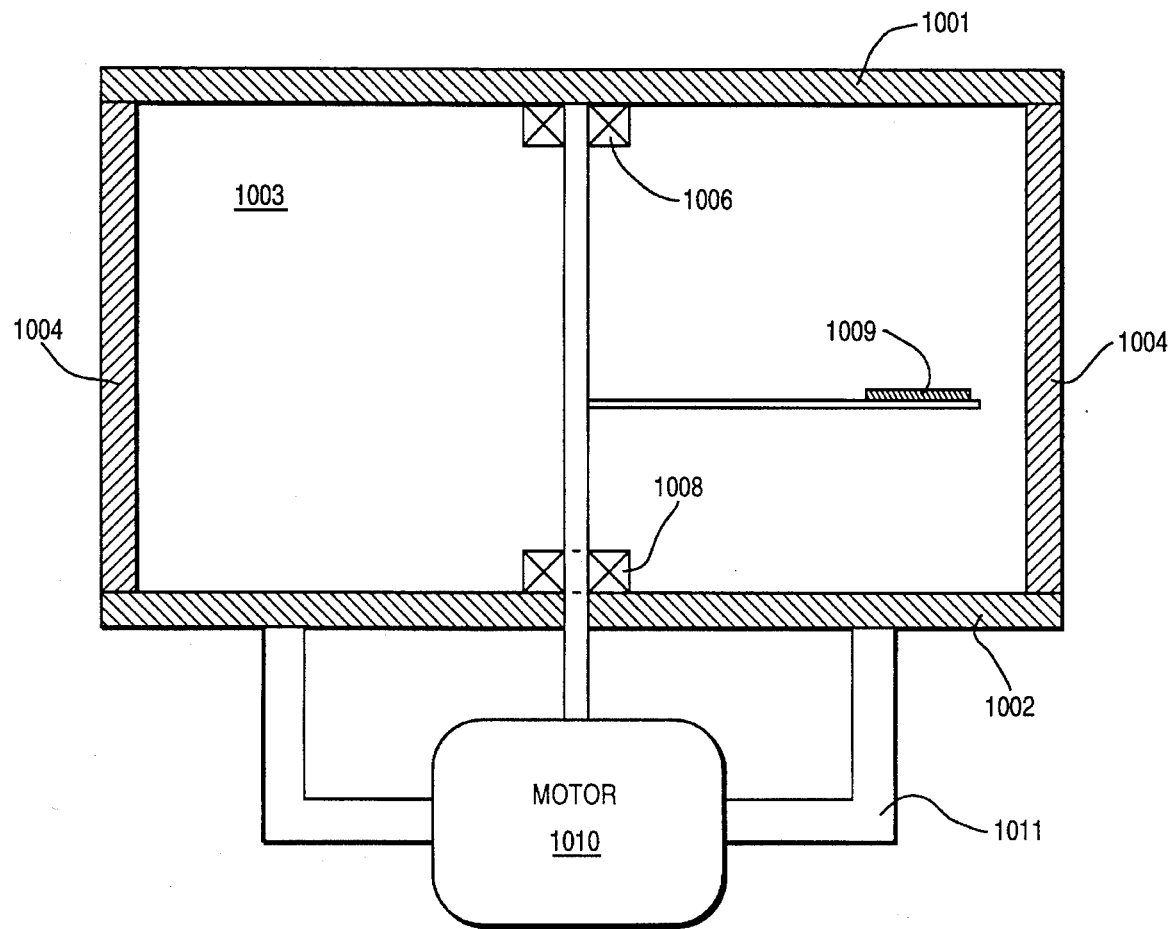
FIG_10

TWO-AXIS MAGNETICALLY COUPLED ROBOT

This is a continuation of application Ser. No. 08/025,204, filed Mar. 2, 1993 now U.S. Pat. No. 5,355,066, which is a divisional of application Ser. No. 07/644,852, filed Jan. 22, 1991 now U.S. Pat. No. 5,227,708, which is a continuation/divisional of application Ser. No. 07/424,771, filed Oct. 20, 1989 now abandoned.

In the figures, the first digit of a reference numeral indicates the first figure in which is presented the element indicated by that reference numeral.

BACKGROUND OF THE INVENTION

This invention relates in general to robots for use in integrated circuit production and relates more particularly to a robot that is magnetically coupled to reduce particulate contamination within one or more process chambers.

Integrated circuit processing technology is continuously concerned with reducing the feature size of circuits to increase the amount of circuitry that can be packed onto an integrated circuit of a given size and to increase the speed of operation by reducing the distance that signals need to travel within such circuits. Particulates of diameter even several times smaller than the feature size of a component can cause failure of the IC if a particulate was present at a critical location in the IC during an important process step. This problem is particularly acute for large area ICs such as microprocessors and ≧4 megabit memories because such ICs have an increased area over which a critical defect can occur.

The multilayer structure of typical ICs also increases the effect of particulates on yield because a particulate incorporated into one level of an IC can affect not only the circuitry on that level, but also circuitry on other levels. A defect in an embedded level of an IC can propagate through overlying layers, distorting the topography and thus disrupting operation of those circuit elements. For these reasons it is important to minimize the amount of particulates that come into contact with a wafer immediately before and during processing.

FIG. 1 illustrates common particulates and particulate sizes that are present in the ambient atmosphere. Expensive, intricate clean rooms and clean room procedures are utilized to significantly reduce the amount of airborne particulates to which a wafer is exposed during IC fabrication. Unfortunately, clean rooms cannot prevent particulates from being produced within an integrated circuit fabrication system.

FIG. 2 illustrates an existing wafer handling system 20 that allows a robot 21 to supply wafers to any of a plurality of IC processing chambers. Robot 21 includes an extensible arm 28 that can extend a wafer blade 29 radially into any of chambers 23–27. Arm 28 is mounted on a rotatable table 210 that enables the extensible arm to be directed at any selected one of chambers 23–27. A vacuum is maintained in chamber 211 containing the robot so that the chambers 24–27 and 211 can be carefully cleaned and purged before wafers are introduced for processing. This system enables wafers 22 to be exchanged between a wafer cassette elevator 23 and any of the chambers 24–27 without breaking vacuum in these chambers. Unfortunately, the mechanical steps of moving wafers among the chambers and from the wafer cassette elevator 21 to the chambers and back produces some particulates that can contaminate the wafers. It is therefore important to minimize the amount of particulate production by such a robot.

Rotatable table 210 and robot 21 are each coupled to motors exterior to chamber 211 to prevent wafers from being contaminated by operation of such motors. These motors are typically in an atmospheric environment, so rotary seals are required to separate chamber 211 from the environment in which the motors are contained. These seals enable the motor shafts to extend between the motor and robot chambers while preserving the pressure difference between these chambers. Tests have shown that these rotary seals are a major source of particulate generation within chamber 211.

In a robot system manufactured by Anelva, these rotary seals are replaced by a magnetic coupler 30 illustrated in FIG. 3. Coupler 30 consists of an outer assembly 31, a vacuum assembly 38 and an inner assembly 313.

Outer assembly 31 includes a cylindrical casing 32, a bottom cap 33 and a top cap 34. Casing 32 encloses a chamber 35 and has attached to its inner wall a set of six bar magnets 36 polarized in the radial direction of casing 32. Bottom cap 33 includes a ball bearing ring 37 into which can be fitted vacuum assembly 38.

Vacuum assembly 38 includes a flange 39 and a cylindrical shell 310 enclosing an inner cavity 311. In an integrated circuit processing system utilizing a robot such as that shown in FIG. 2, wall 40 (see FIG. 4) between chamber 41 containing motor 42 and chamber 211 containing the robot contains a hole of diameter slightly larger than the outer diameter of cylindrical shell 310. A vacuum ring 43 (see FIG. 4) is slipped over cylindrical shell 310 which is then inserted through this hole in the wall and attached to the wall by flange bolts through flange 39 with sufficient pressure against the vacuum ring to maintain the pressure difference between the motor and robot chambers.

Inner assembly 313 includes a ferrite inner pole section 314 having a set of six poles 315. On one end of section 314 is a ball bearing ring 316 and on the other end is a shaft 317 over which is slipped a ball bearing ring 318. When this inner assembly is inserted into inner cavity 311, ball bearing rings 316 and 318 cooperate to center shaft 317 and inner pole section 314 within cavity 311 and to enable inner pole section 314 and shaft 317 to rotate easily within this cavity. Shaft 317 is then connected to the robot to activate various operations of that robot.

Outer assembly 31 is slipped over shell 310 until shell 310 fits into ball bearing ring 37. Ball bearing rings 37, 316 and 318 enable both inner assembly 313 and outer assembly 31 to rotate relative to vacuum assembly 38. A motor is connected to outer assembly 31 to controllably rotate that assembly relative to the vacuum assembly. Pole magnets 36 within outer assembly 36 each magnetically couple to an associated pole 315 of ferrite inner pole section 314 so that the inner assembly rotates with the outer assembly.

This magnetic coupler enables elimination of the rotary seals, but exhibits several deficiencies. First, the magnetic coupler should allow more than one rotatable axis to penetrate through the wall between the motor and robot chambers so that more than one degree of motion can be imparted by the motor section to the robot. Second, the magnetic coupling between the outer and inner assemblies should be stronger. Third, the structure of the coupling should be such that the vertical position of the robot does not vary when a vacuum is established in the robot chamber. Such variation could produce misalignment of a robot blade with a wafer in a chamber external to chamber 211.

SUMMARY OF THE INVENTION

In accordance with the illustrated preferred embodiment, a two-axis magnetically coupled robot is presented. These two rotatable axes enable two different robot actions to be controlled, such as rotation of the robot and linear, radial extension of a robot arm. Such radial extension of the robot arm more effectively extends the robot arm through a wafer transfer slit than does the arcing movement of the robot 28 of FIG. 2. In contrast to the Anelva robot discussed above, the motor chamber extends upward into the robot chamber so that the magnets that are attached directly to a motor are inside of the portion of the magnetic coupling that is within the robot chamber. This enables the side wall of the motor chamber to extend entirely through the robot chamber and provide support to both the top and bottom walls of the robot chamber. The utility of this can be understood by reference to FIG. 4.

FIG. 4 illustrates a problem that occurs in a robot system, like the Anelva system discussed above, in which the drive motor 42 directly attaches to magnets that are outside of the inner pole section 314 that is attached directly to robot 44. In this illustrated embodiment, inner pole section 314 couples to a robot 44 having a wafer blade 45 that is to controllably extend through a wafer exchange slot 46 in sidewall 47 of robot chamber 41 to transfer wafers into and out of chamber 41. When a vacuum is created in chamber 41, this bows wall 40 inward producing a vertical displacement of blade 45 upward relative to wafers in other chambers of a wafer handling systems such as shown in FIG. 2. Because outer assembly 31, which is directly attached to motor 42, is at a greater distance from the motor rotation axes than is inner pole section 314, which is attached directly to robot 44, this outer assembly 31 cannot be extended upward through chamber 211 without interfering with the operation of robot 44. However, if motor chamber 41 extended upward into the robot chamber and the power coupled from inside the motor chamber outward across the sidewall of the motor chamber into the robot chamber (instead of from outside inward as in FIG. 4), then the motor chamber sidewall could extend from the bottom wall of the robot chamber to the top wall of robot chamber. For such a configuration, when a vacuum is produced in the robot chamber, the sidewall of the motor chamber prevents the bottom wall of the robot chamber from bowing upward and displacing the robot vertically relative to wafers in other chambers of the wafer handling system. Also, the motor chamber is accessible from above, thereby simplifying repair or replacement of parts within the motor chamber.

In accordance with the illustrated preferred embodiment, a converter is presented that converts the rotational motion of two motor shafts into separately controllable rotation of the robot and linear, radial extension of a robot arm. Each of these two motor shafts is magnetically coupled outward across the sidewall of the motor chamber into the robot chamber. Within the motor chamber, each motor shaft is rigidly connected to an associated set of N magnets that are closely spaced from the sidewall of the motor chamber. Each of these sets of magnets magnetically couples to an associated set of ferromagnetic elements (preferably a set of N magnets) in the robot chamber to transfer power from a motor to the robot. Even when these ferromagnetic elements are not permanent magnets, they become magnetically polarized by the associated ring of magnets and therefore, the work "magnet" herein will also refer to nonpermanent magnets that are magnetically polarized during use of the magnetic coupler.

In one embodiment, these ferromagnetic elements are supported in two rings that are concentric with the sets of magnets to which these elements couple. In other embodiments, each set of magnets can be grouped into one or more clusters that are not in the form of a ring. The robot converts the rotational motion of these two sets of ferromagnetic elements into general rotational motion of the robot and radial extension of a robot arm.

DESCRIPTION OF THE FIGURES

FIG. 1 illustrates common particulates and particulate sizes that are present in the ambient atmosphere.

FIG. 2 illustrates a wafer handling system 20 that allows a robot 21 to supply wafers to any of a plurality of IC processing chambers.

FIG. 3 illustrates the components of a magnetic coupler utilized in a robot manufactured by Anelva.

FIG. 4 illustrates an integrated circuit processing system utilizing the magnetic coupler of FIG. 3.

FIG. 5 illustrates a magnetic coupler for magnetically coupling rotational motion from one or more motors in a motor chamber into another chamber surrounding the motor chamber.

FIG. 6 illustrates a lower magnetic coupler that couples rotation of a first motor to a first robot arm.

FIG. 7 illustrates an upper magnetic coupler that couples rotation of a second motor to a second robot arm.

FIG. 8 presents a converter for converting rotational motion of a pair of robot arms into separate rotation of a robot blade about a central axis and linear, radial translation of the robot blade.

FIG. 9 illustrates the structure of one of the robot arms.

FIG. 10 illustrates an alternate embodiment in which additional support is provided between the top and bottom walls of a robot vacuum chamber to substantially eliminate vertical displacement of a robot when vacuum is produced within this chamber.

DESCRIPTION OF THE PREFERRED EMBODIMENT

FIG. 5 illustrates a magnetic coupler suitable for magnetically coupling one or more motors 51 and 52 from a cylindrical motor chamber 53 into a second chamber 54 that radially encircles the cylindrical motor chamber. In this embodiment, motors 53 are electric motors, but in alternate embodiments, these motors can be replaced by pneumatic motors, gas-powered motors or any other actuator that can provide rotational power. As used herein, the term motor is to have this broad meaning. A sidewall 55 defines the radial extent of motor chamber 53 and enables a pressure difference to exist between chambers 53 and 54. In this particular embodiment, chamber 53 is a robot chamber in which is contained a robot that is to transfer wafers to and from a set of reaction chambers disposed circumferentially around the robot. Selection of one of these chambers for wafer transfer is achieved by rotation of the robot. Transfer of a wafer into or out of the selected chamber is achieved by linear, radial extension of a robot arm into and out of the selected chamber.

Motor 51 is bolted to a motor mount 56 that rests on a shoulder 57 of sidewall 55. Alignment pins 58 extend from mount 56 into shoulder 57 to prevent rotation of mount 56 relative to sidewall 55. Motor 52 is bolted to a motor mount 59 that has a shoulder 510 that rests on top of sidewall 55. Alignment pins 511 prevent rotation of mount 59 relative to sidewall 55. The use of shoulders and alignment pins to correctly position these motors enables quick installation or removal of these motors. The ability to access, install and remove these motors through a top opening 512 also significantly reduces down time to replace a motor and simplifies routine maintenance of these motors. Such ease of maintenance and repair are important to high average wafer throughput through the wafer processing system.

Motor 51 is coupled to a reduction gear 513 to reduce the rotation speed of a typical motor to a rotation of gear output shaft 514 more appropriate for providing power to the robot. Reduction gear output shaft 514 is attached to a magnet clamp 515 that presses against a bearing 516 and that holds a set of sixteen magnets 517, each of which is closely space from sidewall 55.

Magnet clamp 515 (illustrated in greater detail in FIG. 6) contains, for each of the sixteen magnets clamped to it, a pair of radial outward fingers 61 and 62 that retain that magnet laterally. Each such finger has a shoulder 63 near its base to retain the associated magnet radially. Bolted to clamp 515 vertically above and below the magnets are a pair of retainer rings that lock these magnets into position vertically. Similarly, motor 52 is connected through a reduction gear 518 and a gear output shaft 519 to a magnet clamp 520 that presses against a bearing 521 and that holds a set of sixteen magnets 522. This magnet clamp also has radial outward fingers and shoulders that retain each magnet within the plane of the magnet clamp. Bolted to this magnet clamp above and below the magnets are a pair of magnet retainer rings that prevent vertical motion of these magnets.

Robot vacuum chamber 54 is enclosed by cylindrical inner wall 55, an outer wall 811 (shown in FIG. 8), top wall 523 and bottom wall 524 which are bolted to one another. In this particular embodiment, walls 524 and 811 are formed as one unitary piece. A vacuum seal of chamber 54 is created by vacuum rings 525 and 526. Within robot chamber 54 are a set of sixteen magnets 527 retained within the plane of the magnets by a magnet clamp 528 that is similar to clamps 515 and 520, except that the fingers extend radially inward. Magnet retainer rings above and below the magnets are bolted to clamp 528 to retain these magnets vertically. A similar set of magnet clamp 529 and retainer rings hold a set of 16 magnets 530. A set of bearings 531–534 enable clamps 528 and 529 to rotate about motor axis A.

As illustrated in FIGS. 6 and 7, all magnets 517 have the same magnetic pole pointing in the same circumferential direction around a rotation axis A. Similarly, all magnets 530 have the same magnetic pole pointing in the same circumferential direction around rotation axis A, but this circumferential direction is opposite to that for magnets 522. Radial pole plates 64 and 65 are formed of a ferromagnetic material so that the magnetic fields from magnets 517 are concentrated into radial directions for coupling to the magnets 530. Similarly, radial pole plates 66 and 67 concentrate the magnetic fields from magnets 530 into radial directions for coupling to magnets 517. As a result of the opposite circumferential directions of magnets 517 and 530, ring 529 rotates to a position for which each South pole plate 64 is circumferentially aligned with a North pole plate 66 and each North pole plate 65 is circumferentially aligned with a South pole plate 67. The concentration of magnetic field radially between these plates 64–67 produces a strong circumferential coupling that makes them rotate together over a wide range of torque that exceeds the amount of torque that can be provided by motor 51. As a result of this, when motor 51 rotates the set of magnets 517, then magnets 530 will rotate at the same rotation rate in the same rotation direction. This is the intended magnetic coupling of power across wall 55 from magnets 517 to 530. Similarly, when motor 52 rotates the set of magnets 522, then magnets 527 will rotate at the same rotation rate in the same direction. This is the intended magnetic coupling of power across wall 55 from magnets 522 to 527.

As illustrated in FIG. 7, magnets 522 each has its magnetic poles oriented circumferentially. However, in contrast to magnets 517 in FIG. 6, every second magnet around the ring has its North pole oriented clockwise about axis A and the remainder have their North pole oriented counterclockwise. This alternating pattern of orientations is also utilized for magnets 527. Radial plates 71–74 also are ferromagnetic so that they concentrate the magnetic fields radially between clamps 520 and 528. Clamp 528 rotates to a stable position at which each North pole is opposite a South pole of clamp 520. The magnetic coupling is strong enough that a clamp 528 will rotate with clamp 520 for torques ranging up to a limit that exceeds the torque from motors 51 and 51.

This pattern of magnetic pole orientations is selected to reduce magnetic coupling between the magnets in sets 522 and 528 with the magnets in sets 517 and 530. This reduction can be seen as follows. If the pattern of orientations were the same in sets 527 and 530, then a minimum energy as a function of relative angular positions of clamps 528 and 529 would occur when each magnet 527 was directly over a magnet 530 because this would bring each North pole in set 530 as close as possible to a South pole in set 527 and would also bring each South pole in set 530 as close as possible to a North pole in set 527. However, when the poles are alternated circumferentially as in FIG. 7, then if a magnet 65 (in FIG. 6) is directly below a magnet 75 (in FIG. 7) such that each magnets North pole is as close as possible to a South pole in the other set, then each magnet 66 will have its North pole as close as possible to a North pole of magnet 76 and its South pole as close as possible to a South pole of magnet 76. The net repulsions and attractions will substantially cancel so that there is a significantly reduced amount of coupling between magnets 530 and 527. This also significantly reduces the coupling of magnets 530 with magnets 522 and the coupling of magnets 527 with magnets 517.

FIG. 8 is a top view of a robot 80 utilizing the magnetic coupler of FIG. 5. A first strut 81 is rigidly attached to magnet clamp 528 (see FIG. 7) and a second strut 82 is rigidly attached to magnet clamp 529 (see FIG. 6). A third strut 83 (in FIG. 8) is attached by a pivot 84 to strut 81 and by a pivot 85 to a wafer blade 86. A fourth strut 87 is attached by a pivot 88 to strut 82 and by a pivot 89 to wafer blade 86. This structure of struts 81–83, 87 and pivots 84, 85, 88, 89 form a "frog leg" type connection of wafer blade 86 to magnet clamps 528 and 529. When magnet clamps 528 and 529 rotate in the same direction with the same angular velocity, then robot 80 also rotates in this same direction with the same velocity. When magnet clamps 528 and 529 rotate in opposite directions with the same absolute angular velocity, then there is no rotation of assembly 80, but instead there is a linear radial movement of wafer blade 86 to a position illustrated by dashed elements 81'–89'. To provide light-weight rigidity so that struts 81 and 82 can be moved rapidly without an undue amount of wiggle, these struts should be a four-sided box sheet metal structure as in FIG. 9 (for strut 82).

In this figure, a wafer 89 is shown as being loaded on wafer blade 86 to illustrate that the wafer blade can be extended through a wafer transfer slot 810 in a wall 811 to transfer such a wafer into or out of the robot chamber. This robot can be used in place of robot 28 of FIG. 2 to provide a robot that is free of particulate generation via a rotary vacuum seal. The mode in which both motors rotate in the same direction at the same speed can be used to rotate the robot from a position suitable for wafer exchange with one of chambers 23–27 to a position suitable for wafer exchange with another of these chambers. The mode in which both motors rotate with the same speed in opposite directions is then used to extend the wafer blade into one of these chambers and then extract it from that chamber. Some other combination of motor rotation can be used to extend or retract the wafer blade as the robot is being rotated about motors 51 and 52. Because side wall 55 extends between top wall 523 and bottom wall 524, when a vacuum is produced within chamber 54, there is no vertical displacement of robot blade 86 with respect to wafer rest positions within external chambers, thereby maintaining alignment of wafer blade 86 with wafer wafers external to the robot vacuum chamber for any range of internal pressures within cavity 54.

FIG. 10 illustrates an alternate embodiment of providing additional support between a top wall 1001 and a bottom wall 1002 of the robot chamber 1003. This "additional" support is in addition to support by sidewall 1004. In this embodiment, the additional support is provided by a rotatable shaft 1005. In this embodiment, the robot consists of motor 1010, thrust bearings 1006 and 1007, and wafer blade 1008. This robot has the single degree of freedom to rotate a wafer 1009 to any selected angular position about shaft 1005. Thrust bearings 1006 and 1007 enable shaft 1005 to rotate even though shaft 1005 is compressed by a force equal to twice the atmospheric pressure on top wall 1001. In an alternate of this embodiment, motor 1010 is anchored to bottom wall 1002 by support 1011 and thrust bearing 1007 is located within motor 1010.

To keep wafer blade 86 directed radially away from the rotation axes of motors 51 and 52, a pair of intermeshed gears 812 and 813 are included at pivots 85 and 89. These gears are loosely meshed to minimize particulate generation by these gears. To eliminate play between these two gears because of this loose mesh, a weak spring 814 extends between a point 815 on one gear to a point 816 on the other gear such that the spring tension lightly rotates these two gears in opposite directions until light contact between these gears is produced.

To dampen oscillations in the robot during rotation or blade extension, wall 55 should be selected to be conductive so that eddy currents therein are produced to damp such oscillations. This wall can be coated with a conductive coating to enhance these eddy currents, but preferably wall 55 is of a conductive material such as aluminum so that bulk eddy currents can be generated.

I claim:

1. A robot comprising:
    a first arm assembly rotatable about a first axis of rotational symmetry;
    a second arm assembly rotatable about a second axis of rotational symmetry; and
    a drive mechanism coupled to the first arm assembly and the second arm assembly for rotating the first arm assembly and the second arm assembly, said drive mechanism comprising a first motor and a first magnetic coupler coupled to the first motor, wherein the first magnetic coupler rotates the first arm assembly in response to activation of the first motor and comprises
    a first set of magnets coupled to the first motor and retained in a first ring that maintains the first set of magnets in a plane during rotation of the first set of magnets, and
    a second set of magnets coupled to the first arm assembly and retained in a second ring that maintains the second set of magnets in the plane during rotation of the second set of magnets,
    wherein the first set of magnets rotates in response to rotation motion created by activation of the first motor, and further wherein the first set of magnets are magnetically coupled to the second set of magnets, such that rotations of the first set of magnets are imparted to the second set of magnets to cause rotation of the second set of magnets to rotate the first arm assembly.

2. The robot defined in claim 1 wherein the drive mechanism further comprises a second motor and a second magnetic coupler coupled to the second motor, wherein the second magnetic coupler rotates the second arm assembly in response to activation of the second motor.

3. The robot defined in claim 1 wherein the drive assembly further comprises a first shaft coupled to the first magnetic coupler, and wherein rotational motion is transmitted between the first magnetic coupler and the first shaft.

4. The robot defined in claim 2 wherein the drive assembly further comprises a second shaft coupled to the second magnetic coupler, and wherein rotational motion is transmitted between the second magnetic coupler and the second shaft.

5. The robot defined in claim 1 wherein the first arm assembly and the second arm assembly are within a chamber.

6. The robot defined in claim 1 wherein the first magnetic coupler magnetically couples rotational motion produced using the first motor across a first section of the wall.

7. The robot defined in claim 1 wherein the first axis of rotational symmetry and the second axis of rotational symmetry are a common axis.

8. A robot comprising:
    a first arm assembly and a second arm assembly coaxially rotatable about an axis of rotational symmetry;
    a drive mechanism coupled to the first arm assembly and the second arm assembly for rotating the first arm assembly and the second arm assembly, said drive mechanism comprising
    a first motor and a second motor,
    a first magnetic coupler coupled to the first motor for rotating the first arm assembly in response to activation of the first motor; and
    a second magnetic coupler coupled to the second motor for rotating the second arm assembly in response to activation of the second motor;
    wherein rotations of the first and second arm assemblies are converted into rotation of the robot about the axis of rotational symmetry and linear, radial extension of a robot arm from the axis of rotational symmetry.

9. The robot defined in claim 8 wherein the drive assembly further comprises a first shaft coupled to the first magnetic coupler and a second shaft coupled to the second magnetic coupler, and wherein rotational motion is transmitted between the first magnetic coupler and the first shaft and between the second magnetic coupler and the second shaft.

10. The robot defined in claim 8 wherein the first arm assembly and the second arm assembly are within a chamber.

11. The robot defined in claim 8 wherein the first magnetic coupler magnetically couples rotational motion produced using the first motor across a first section of the wall and the second magnetic coupler magnetically couples rotational motion produced using the second motor across a second section of the wall.

12. The robot defined in claim 11 wherein rotational motion produced using the first motor is magnetically coupled across a first cylindrical section of the wall to cause the first arm assembly to rotate and rotational motion produced using the second motor is magnetically coupled across a second cylindrical section of the wall to cause the second arm assembly to rotate.

13. A robot comprising:

a first magnetic coupler for magnetically coupling rotational motion generated using a first motor across a first cylindrical section of a wall to a first member that is rotatable about an axis of rotational symmetry of said first cylindrical section of the wall;

a second magnetic coupler for magnetically coupling rotational motion generated using a second motor across a second cylindrical section of the wall to a second member that is rotatable about an axis of rotational symmetry of said second cylindrical section of the wall;

a first arm assembly located in a chamber and coupled to the first member, said first arm assembly moving in response to rotation of the first member by the first motor; and a second arm assembly located in the chamber and coupled to the second member, said second arm assembly moving in response to rotation of the second member by the second motor;

wherein the first and second arm assemblies are coupled to the first and second members, respectively, such that rotations of the first and second members cause rotations of a portion of each of the first and second arm assemblies, respectively, that are converted into a pair of independent motions of said robot.

14. The robot defined in claim 13 wherein movements of the first arm assembly and second arm assembly are interrelated.

15. The robot defined in claim 13 wherein the first magnetic coupler comprises a first ring of magnets adjacent to one side of said first cylindrical section of a wall and a second ring of magnets on the other side of said first cylindrical section of the wall, wherein the first motor is coupled to cause the first ring of magnets to rotate and the second ring of magnets is coupled to the first member, such that rotation of the first ring of magnets causes rotation of the first member.

16. The robot defined in claim 15 wherein the second magnetic coupler comprises a third ring of magnets adjacent to one side of said second cylindrical section of a wall and a fourth ring of magnets on the other side of said second cylindrical section of the wall, wherein the second motor is coupled to cause the third ring of magnets to rotate and the fourth ring of magnets is coupled to the second member, such that rotation of the third ring of magnets causes rotation of the second member.

17. The robot defined in claim 13 wherein the first arm assembly comprises at least one leg of a frog-leg assembly.

18. The robot defined in claim 13 wherein the first arm assembly and the second arm assembly rotate and perform linear radial movements in response to rotation of the first member and second member respectively.

19. A magnetic coupling mechanism comprising:

a first motor and a second motor;

a first set of magnets and second set of magnets mounted for rotation by the first motor and the second motor respectively, wherein the first and second sets of magnets are located on one side of a wall;

a first arm assembly coupled to a first coaxial rotatable member;

a second arm assembly coupled to a second coaxial rotatable member;

a third set of magnets and fourth set of magnets positioned on the other side of the wall, wherein the third and fourth sets of magnets are coupled to the first and second coaxial rotatable members respectively, wherein the first set of magnets are magnetically coupled to the third set of magnets and the second set of magnets are magnetically coupled to the fourth set of magnets, such that rotation created using the first and second motors on said one side of the wall causes corresponding rotation of the first and second rotatable members on the other side of the wall and, thus, movements of the first arm assembly and second arm assembly respectively.

20. The robot defined in claim 19 wherein movements of the first arm assembly and second arm assembly are interrelated.

21. The robot defined in claim 19 wherein the first set of magnets comprises a first ring of magnets adjacent to one side of said first cylindrical section of a wall and a second ring of magnets on the other side of said first cylindrical section of a wall, wherein the first motor is coupled to cause the first ring of magnets to rotate and the second ring of magnets is coupled to the first coaxial rotatable member, such that rotation of the first ring of magnets causes rotation of the first coaxial rotatable member.

22. The robot defined in claim 21 wherein the second set of magnets comprises a third ring of magnets adjacent to one side of said second cylindrical section of a wall and a fourth ring of magnets on the other side of said second cylindrical section of a wall, wherein the second motor is coupled to cause the third ring of magnets to rotate and the fourth ring of magnets is coupled to the second coaxial rotatable member, such that rotation of the third ring of magnets causes rotation of the second coaxial rotatable member.

23. The robot defined in claim 19 wherein the first arm assembly is a part of a frog-leg assembly.

24. The robot defined in claim 19 wherein the first arm assembly and the second arm assembly rotate and perform linear radial movements in response to rotation of the first coaxial rotatable member and second coaxial rotatable member respectively.

25. A robot apparatus for moving a workpiece support comprising:

a robot vacuum chamber;

a robot arm assembly within said vacuum chamber having a workpiece support, wherein the robot arm assembly includes at least one rotatable member;

a rotatable support shaft within the vacuum chamber extending between opposite sides of the robot vacuum chamber and coupled to said at least one rotatable member of said robot arm assembly to position and maintain the workpiece support at a desired angular location when a vacuum is created in the robot vacuum chamber;

at least one motor assembly coupled to said robot arm assembly to cause said at least one rotatable member to rotate about an axis, wherein said at least one motor assembly includes a first portion coupled to the rotatable support shaft and a second portion outside the vacuum chamber, wherein the second portion transmits movements to the first portion through magnetic coupling to cause rotation of the rotatable support shaft to position the workpiece support.

26. The robot apparatus defined in claim 25 wherein the rotatable support comprises a load bearing support.

27. The robot apparatus defined in claim 25 wherein the rotatable support reduces displacement of the robot arm assembly when a vacuum is produced in the robot vacuum chamber.

28. The robot apparatus defined in claim 25 wherein the first portion and the third portion of said at least one motor assembly comprise rings of magnets.

29. The robot apparatus defined in claim 25 further comprising a first bearing between one end of the rotatable shaft and a first vacuum chamber wall and a second bearing between the opposite end of the rotatable shaft and a second vacuum chamber wall.

30. The robot apparatus defined in claim 25 wherein the rotatable support shaft has sufficient strength to withstand a compressive stress in the rotatable support shaft when the vacuum is created in the robot vacuum chamber.

31. A robot comprising:
a first magnetic coupler for magnetically coupling rotational motion generated using a first motor across a first cylindrical section of a wall to a first member that is rotatable about an axis of rotational symmetry of said first cylindrical section of the wall;
a second magnetic coupler for magnetically coupling rotational motion generated using a second motor across a second cylindrical section of the wall to a second member that is rotatable about an axis of rotational symmetry of said second cylindrical section of the wall;
a converter coupled to the first and second member to convert rotations of the first and second members into a pair of independent motions of said robot.

32. The robot defined in claim 31 wherein the converter converts rotations of the first and second members into rotation of the robot and linear, radial extension of a robot arm.

33. The robot defined in claim 31 further comprising first and second struts coupled to the first and second members respectively, wherein rotations of the first and second members cause corresponding rotations of the first and second struts that are converted into the pair of independent motions.

34. A robot comprising:
a first magnetic drive for driving a first member disposed on a first side of a wall so as to be rotatable without contact to the wall, wherein the first magnetic drive comprises a first drive portion disposed on a second side of the wall to rotate the first member;
a second magnetic drive for driving a second member disposed on the first side of a wall so as to be rotatable without contact to the wall, wherein the second magnetic drive comprises a second drive portion disposed on the second side of the wall to rotate the second member;
a first arm assembly located in a chamber and coupled to the first member, said first arm assembly moving in response to rotation of the first member by the first drive portion; and
a second arm assembly located in the chamber and coupled to the second member, said second arm assembly moving in response to rotation of the second member by the second drive portion;
wherein the first and second arm assemblies are coupled to the first and second members, respectively, such that rotations of the first and second members cause rotations of a portion of each of the first and second arm assemblies, respectively, that are converted into a pair of independent motions of said robot.

35. The robot defined in claim 34 wherein rotations of the first and second arm assemblies are converted into rotation of the robot about the axis of rotational symmetry and linear, radial extension of a robot arm from the axis of rotational symmetry.

36. The robot defined in claim 34 further comprising a wafer blade coupled to the first arm assembly and second arm assembly.

37. The robot defined in claim 36 further comprising a pair of intermeshed gears coupling the first and second arm assemblies to the wafer blade.

38. The robot defined in claim 34 wherein rotations of the portions of the first and second arm assemblies in a same direction are converted into one of the pair of independent motions and rotations of the portions of the first and second arm assemblies in opposite directions are converted into another of the pair of independent motions.

39. A robot comprising:
a first and second members coaxially rotatable about a first axis;
a first magnetic drive for driving the first member disposed on a first side of a wall so as to be rotatable without contact to the wall, wherein the first magnetic drive comprises a first drive portion disposed on a second side of the wall to rotate the first member;
a second magnetic drive for driving the second member disposed on the first side of a wall so as to be rotatable without contact to the wall, wherein the second magnetic drive comprises a second drive portion disposed on the second side of the wall to rotate the second member; and
a first arm and a second arm coupled to the first and second members respectively so that rotations of the first and second members rotate the first and second arms respectively causing two independent motions of the robot that include rotation of the robot about the axis of rotational symmetry and linear, radial extension of a robot arm from the axis of rotational symmetry.

40. The robot defined in claim 39 further comprising:
first and second struts coupled to the first and second arms respectively to form first and second arm assemblies; and
a wafer blade coupled to the first and second arm assemblies.

41. The robot defined in claim 40 further comprising a pair of intermeshed gears coupling the first and second arm assemblies to the wafer blade.

42. The robot defined in claim 39 wherein rotations of the first and second arms in a same direction are converted into one of the two independent motions and rotations of the first and second arms in opposite directions are converted into another of the two independent motions.

* * * * *